(12) United States Patent
Pradeep et al.

(10) Patent No.: US 6,544,824 B1
(45) Date of Patent: Apr. 8, 2003

(54) METHOD TO FORM A VERTICAL TRANSISTOR BY FIRST FORMING A GATE/SPACER STACK, THEN USING SELECTIVE EPITAXY TO FORM SOURCE, DRAIN AND CHANNEL

(75) Inventors: Yelehanka Pradeep, Singapore (SG); Jia Zhen Zheng, Singapore (SG); Lap Chan, SF, CA (US); Elgin Quek, Singapore (SG); Ravi Sundaresan, San Jose, CA (US); Yang Pan, Singapore (SG); James Lee Yong Meng, Singapore (SG); Ying Keung, Aberdeen (HK)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/038,390

(22) Filed: Jan. 3, 2002

(51) Int. Cl.$^7$ .......................... H01L 21/00; H01L 21/84
(52) U.S. Cl. ...................... 438/156; 438/192; 438/206; 438/212
(58) Field of Search ................. 438/156, 157, 438/176, 184, 192, 206, 212, 268, 303, 595; 257/135, 302, 328, 329, 330

(56) References Cited

U.S. PATENT DOCUMENTS

| | | | |
|---|---|---|---|
| 4,788,158 A | 11/1988 | Chatterjee | 437/51 |
| 4,982,266 A | 1/1991 | Chatterjee | 357/71 |
| 5,032,529 A | 7/1991 | Beitman et al. | 437/21 |
| 5,218,218 A | 6/1993 | Akazawa | 257/302 |
| 5,302,541 A | 4/1994 | Akazawa | 437/52 |
| 5,340,754 A * | 8/1994 | Witek et al. | 438/156 |
| 5,340,759 A | 8/1994 | Hsieh et al. | 437/41 |
| 5,398,200 A | 3/1995 | Mazuré et al. | 365/174 |
| 5,414,289 A | 5/1995 | Fitch et al. | 257/329 |
| 5,545,586 A | 8/1996 | Koh | 437/89 |
| 5,780,327 A | 7/1998 | Chu et al. | 438/156 |
| 6,372,559 B1 * | 4/2002 | Crowder et al. | 438/157 |
| 6,461,900 B1 * | 10/2002 | Sundaresan et al. | 438/156 |

* cited by examiner

*Primary Examiner*—Wael Fahmy
*Assistant Examiner*—Hoai Pham
(74) *Attorney, Agent, or Firm*—George O. Saile; Rosemary L. S. Pike; William S. Stoffel

(57) ABSTRACT

A method of manufacturing a vertical transistor. A doped region is formed in a substrate. We form sequentially on the substrate: a first spacer dielectric layer, a first gate electrode, a second spacer dielectric layer, a second gate electrode and a third spacer dielectric layer. A trench is formed through the first spacer dielectric layer, the first gate electrode, the second spacer dielectric layer, the second gate electrode and the third spacer dielectric layer. The trench has sidewalls. A gate dielectric layer is formed over the sidewalls of the trench. We form sequentially, in the trench: a first doped layer, a first channel layer, a second doped layer, a third doped layer, a second channel layer, and a fourth doped layer. A cap layer is formed over the structure. Contacts are preferably formed to the doped region, doped layers and gate electrodes.

26 Claims, 3 Drawing Sheets

US 6,544,824 B1

METHOD TO FORM A VERTICAL TRANSISTOR BY FIRST FORMING A GATE/SPACER STACK, THEN USING SELECTIVE EPITAXY TO FORM SOURCE, DRAIN AND CHANNEL

BACKGROUND OF INVENTION

1) Field of the Invention

This invention relates generally to fabrication of a semiconductor device, and more particularly to the fabrication of a MOS transistor with a vertical channel.

2) Description of the Prior Art

Field effect transistors (FET's) are a fundamental building block in the field of integrated circuits. FET's can be classified into two basic structural types: horizontal and vertical. Horizontal, or lateral, FET's exhibit carrier flow from source to drain in a direction parallel (e.g. horizontal) to the plane of the substrate on which they are formed. Vertical FET's exhibit carrier flow from source to drain in a direction transverse to the plane of the substrate (e.g. vertical) on which they are formed.

While horizontal FET's are widely used and favored in the semiconductor industry because they lend themselves easily to integration, vertical FET's have a number of advantages over horizontal FET's. Because channel length for vertical FET's is not a function of the smallest feature size resolvable by state-of-the-art lithographic equipment and methods (e.g. on the order of 0.25 micrometers), vertical FET's can be made with a shorter channel length (e.g. on the order of 0.1 micrometers) than horizontal FET's, thus providing vertical FET's the capability to switch faster and as well as a higher power handling capacity than horizontal FET's. There is also the potential for greater packing density with vertical FET's.

The importance of overcoming the various deficiencies note above is evidenced by the extensive technological development directed to the subject, as documented by the relevant patent and technical literature. The closest and apparently more relevant technical developments in the patent literature can be gleaned by considering U.S. Pat. No. 5,414,289 (Fitch et al.) that shows one vertical transistor that is formed by form gate/spacer stack, etch and then SEG for S/D and channel.

U.S. Pat. No. 5,398,200 (Mazure et al.) describes a two vertical memory transistor cell using epi growth.

U.S. Pat. No. 5,218,218 (Akazawa) shows a vertical Transistor in a trench. Akazawa forms the S/D & channel by diffusion.

U.S. Pat. No. 5,780,327 (Chu et al.) shows a vertical double gate transistor.

U.S. Pat. No. 5,545,586 (Koh) shows a vertical transistor using epi layers.

U.S. Pat. No. 5,340,759 (Hsieh et al.) shows a vertical gate transistor using epi.

U.S. Pat. No. 5,032,529 (Beitman et al.) shows a trench gate VCMOS transistor.

U.S. Pat. No. 4,982,266 (Chjatterjee) and U.S. Pat. No. 5,302,5412 (Akazawa) show other transistor processes.

SUMMARY OF THE INVENTION

It is an object of a preferred embodiment of the present invention to provide a method for fabricating a vertical transistor.

It is an object of a preferred embodiment of the present invention to provide a structure and method for fabricating a vertical transistor by first forming gate/spacer stack, then using selective epitaxy to form source/drain and channel.

The objectives do not limit the scope of the invention in any way.

To accomplish the above objectives, the present invention provides a method of manufacturing a vertical transistor.

A doped region is formed in a substrate. We form sequentially on the substrate, a first spacer dielectric layer, a first gate electrode, a second spacer dielectric layer, a second gate electrode and a third spacer dielectric layer. We form a masking layer having an opening over the third spacer dielectric layer. We form a trench through the first spacer dielectric layer, the first gate electrode, the second spacer dielectric layer, the second gate electrode and the third spacer dielectric layer. The trench has sidewalls. We form a gate dielectric layer over the sidewalls of the trench. We form sequentially, in the trench: a first doped layer, a first channel layer, a second doped layer, a third doped layer, a second channel layer, and a fourth doped layer. We form a cap layer over the structure. Contacts are formed to the doped region, the first gate electrode the second doped layer, third doped layer and the fourth doped layer.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a method of forming a vertical transistor.

Figure 1:
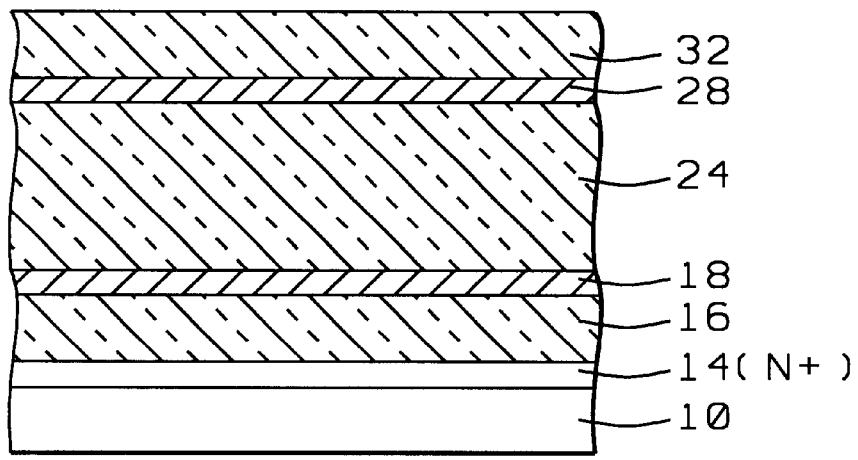
FIGS. 1 through 6 are cross sectional views for illustrating a method for manufacturing a vertical transistor according to the present invention.

As shown in FIG. 1, we form a doped region 14 in a substrate 10. The substrate can be, but is not limited to, a monocrystalline silicon wafer, silicon and insulator (SOI) or a silicon on sapphire (SOS).

The doped region 14 is preferably doped with a first type conductivity impurity (e.g., n-doped) and is preferably formed by an ion implant process. The doped region 14 is preferably a n-doped region formed by an ion implant process. The doped region 14 preferably has a concentration between 1E19 and 1E23 atom/cc. The doped region preferably has the same type impurity doping as the subsequently formed first doped layer 50 (See FIG. 6).

Still referring to FIG. 1, we form sequentially over the substrate: a first spacer dielectric layer 16, a first gate electrode 18, a second spacer dielectric layer 24, a second gate electrode 28 and a third spacer dielectric layer 32.

The first spacer dielectric layer 16 is preferably comprised of silicon oxide, silicon nitride, or silicon oxynitride, and is preferably comprised of silicon oxide.

The first gate electrode 18 can be comprised polysilicon or amorphous silicon and is preferably comprised of polysilicon.

The second spacer dielectric layer 24 can be comprised of silicon oxide, silicon nitride, or Silicon oxynitride and is preferably comprised of silicon oxide.

The second gate electrode 28 can be comprised polysilicon or amorphous silicon and is preferably comprised of polysilicon.

The third spacer dielectric layer 32 can be comprised of silicon oxide, silicon nitride, silicon oxynitride or other dielectric materials, and is preferably comprised of silicon oxide. Any of the spacer layers can be comprised of silicon oxide, silicon nitride, silicon oxynitride or other dielectric materials, and are preferably comprised of silicon oxide.

Figure 2:
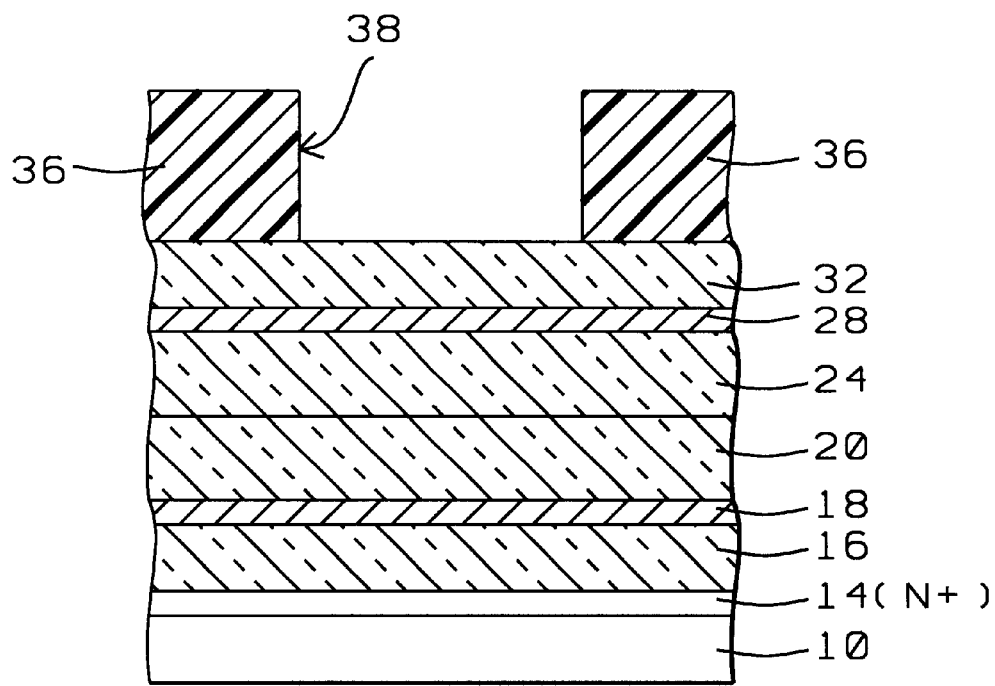

As shown in FIG. 2, we form a masking layer 36 having an opening 38 over the third spacer dielectric layer 32. The masking layer is preferably comprised of photoresist.

Figure 3:
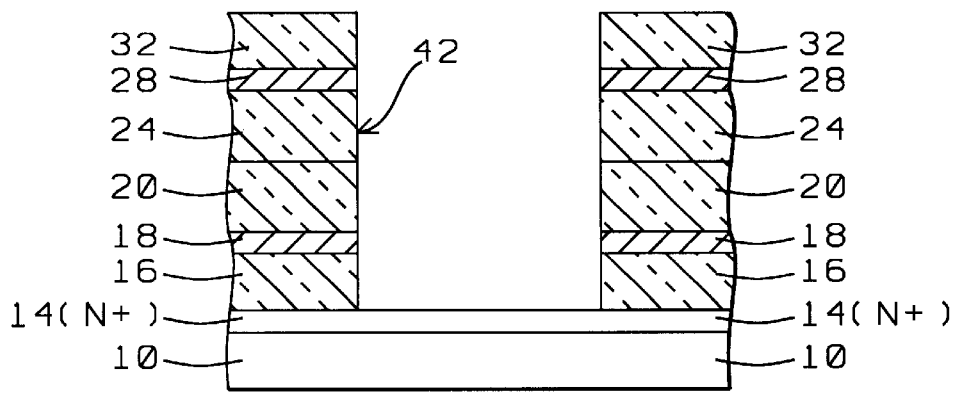

As shown in FIG. 3, we form a trench 42 through the first spacer dielectric layer 16, the first gate electrode 18, the second spacer dielectric layer 24, the second gate electrode 28 and the third spacer dielectric layer 32. The trench 42 has sidewalls. The trench preferably exposes the substrate 10 surface. The trench is preferably formed by an etching process. The trench 42 preferably has a width between 1 $\mu$m and 10 $\mu$m and a depth between 0.2 $\mu$m and 5 $\mu$m. The masking layer is removed.

Figure 4:
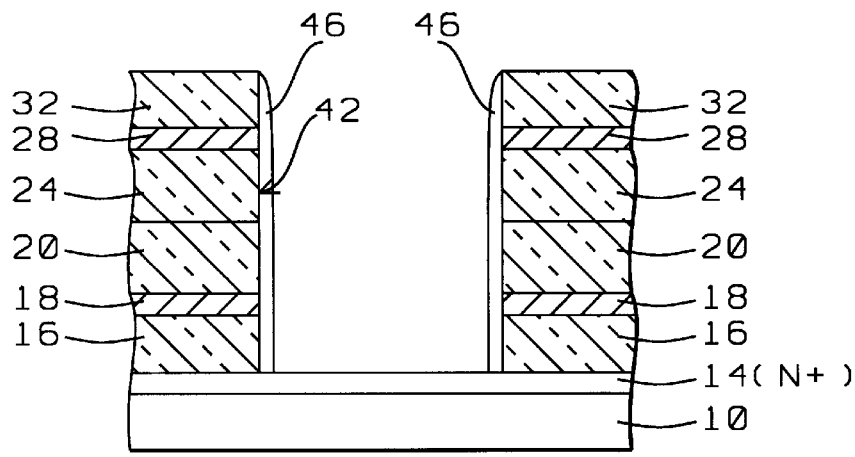

As shown in FIG. 4, we form a gate dielectric layer 46 over the sidewalls of the trench 42. The gate dielectric layer is preferably formed by a blanket deposition and then an anisotropic etch back to form "spacers" (gate dielectric) on the sidewalls 42.

The gate dielectric layer is can be comprised of $SiO_2$, silicon nitride, silicon oxynitride, ONO, $HfO_2$, metal oxides, or any other gate dielectric or high K gate dielectric. The gate dielectric layer is preferably comprised of silicon oxide.

Figure 5:
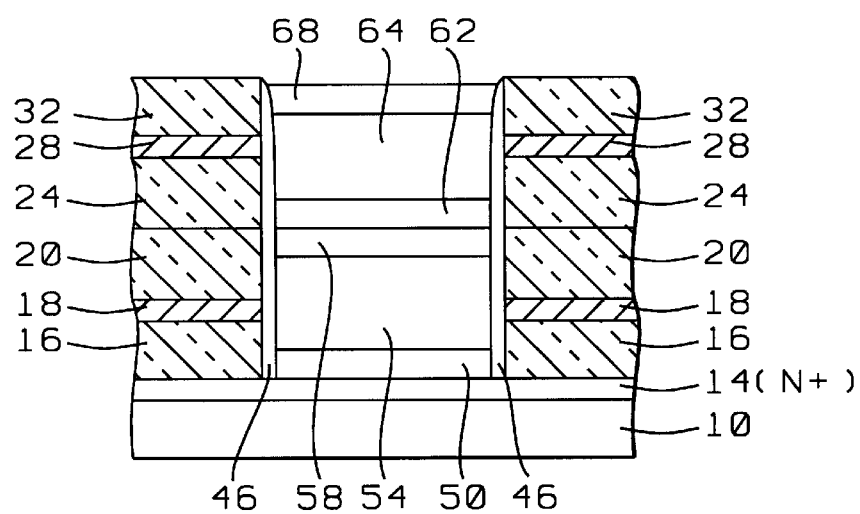

As shown in FIG. 5, we form sequentially in the trench 42, a first doped layer 50, a first channel layer 54, a second doped layer 58, a third doped layer 62, a second channel layer 64, and a fourth doped layer 68. These layers are preferably formed using a selective deposition process (e.g., selective epitaxy process). A selective epitaxy process forms epi (e.g., silicon) only on an exposed silicon surface). No masking and etching is needed.

The first doped layer 50, and the second doped layer 58, are preferably comprised of a first type conductivity material (e.g., silicon doped with a first type conductivity material such as arsenic) and the first channel 54 is preferably comprised of a second (or opposite) conductivity material. The third doped layer 62 and the fourth doped layer 68 are preferably comprised of a second type conductivity material and the second channel is preferably comprised of a first conductivity material.

The first conductivity type can be silicon doped with p-type impurities and the second conductivity type can be silicon doped with n-type impurities.

The first conductivity type is preferably a semiconductor material (e.g., silicon) doped with n-type impurities and the second conductivity type is preferably semiconductor material (e.g., silicon) doped with p-type impurities.

Figure 6:
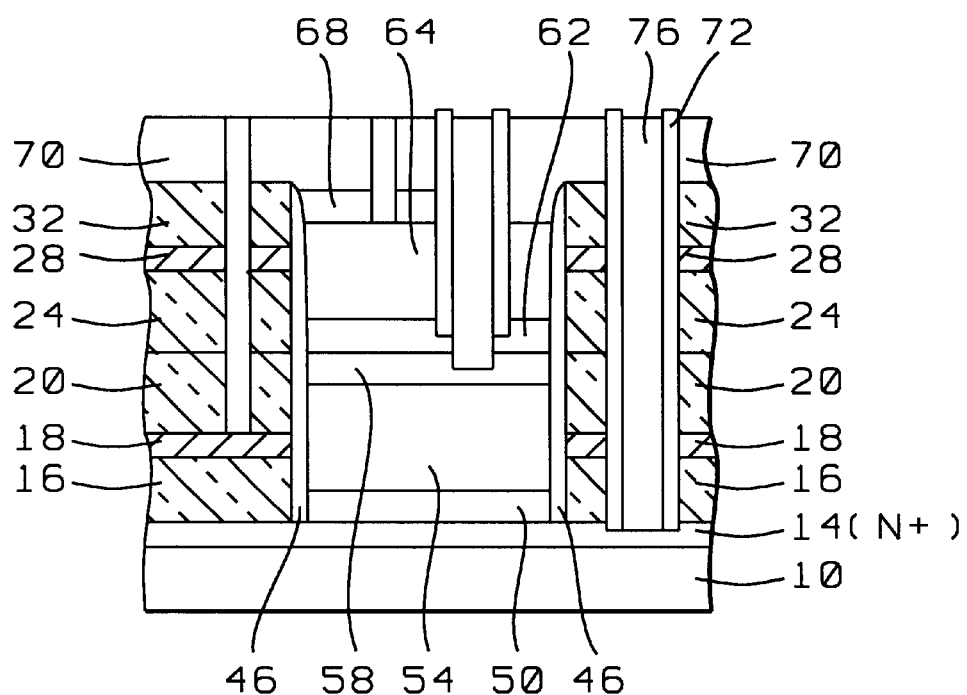

As shown in FIG. 6, we form a cap layer 70 over the third spacer dielectric layer 32. The cap layer is preferably comprised of silicon oxide with a thickness of between about 300 and 1500 Å.

Referring to FIG. 6, then we form contact holes down to the appropriate layers.

Then, preferably dielectric liners 72 are formed in the sidewalls some or all of the contact holes. The dielectric liners are preferably comprised of silicon oxide, silicon oxynitride or silicon nitride.

In the contact holes, we form contacts 76 78 80 82 to the doped region 14, the first gate electrode 18 the second doped layer 58, and the fourth doped layer 68. The contacts are preferably formed of conductive materials, such as metals, such as W. Contacts are preferably formed to all source/drains and gates in the two transistors.

A contact (e.g., common contact) is preferably formed to the third doped region 62.

As shown in FIG. 6, a first MOS transistor is comprised of: the doped layer 50 (e.g., n+)(part of source/drain (S/D)) and first doped layer 50 (source/drain (S/D)-N-doped), first channel layer is the channel (e.g. p-type), first gate electrode 18 and a second doped layer 58 (S/D-n doped).

A second transistor is comprised of: the $3^{rd}$ doped layer 62 (source/drain (S/D) e.g., p-doped), $2^{nd}$ channel region 64 (e.g., n-doped), gate dielectric layer 46, second gate electrode 28, $4^{th}$ doped layer 68 source/drain (S/D) (e.g., p-doped). Contacts are preferably formed to all source/drains and gates in the two transistors.

DEFINITIONS

The term "doped layer" used herein can mean a conductive layer that is doped with an impurity.

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor.

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to an understanding of the present invention, exemplary technical data are set forth based upon current technology. Future developments in the art may call for appropriate adjustments as would be obvious to one skilled.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of a vertical transistor; comprising the steps of:

a) forming a doped region in a substrate; forming sequentially on substrate, a first spacer dielectric layer, a first gate electrode, a second spacer dielectric layer, a second gate electrode and a third spacer dielectric layer;

b) forming a trench through said first spacer dielectric layer, said first gate electrode, said second spacer dielectric layer, said second gate electrode and said third spacer dielectric layer; said trench having sidewalls;

c) forming a gate dielectric layer over said sidewalls of said trench;

d) forming sequentially, in said trench: a first doped layer, a first channel layer, a second doped layer, a third doped layer, a second channel layer, and a fourth doped layer;

e) forming a cap layer over said third spacer dielectric layer and said fourth doped layer; and f) forming contacts to said doped region, said first gate electrode said second doped layer, and said fourth doped layer.

2. The method of claim 1 which further includes before step (a) forming said doped region in said substrate; said doped region is a n-doped region formed by an ion implant process.

3. The method of claim 1 which further includes before step (a) forming said doped region in said substrate; said doped region is a n-doped region formed by an ion implant process and has a concentration between 1E19 and 1E23 atom/cc.

4. The method of claim 1 wherein said first spacer dielectric layer is comprised of silicon oxide.

5. The method of claim 1 wherein said first gate electrode is comprised of polysilicon.

6. The method of claim 1 wherein said second spacer dielectric layer is comprised of silicon oxide.

7. The method of claim 1 wherein said second gate electrode is comprised of polysilicon.

8. The method of claim 1 wherein said third spacer dielectric layer is comprised of silicon oxide.

9. The method of claim 1 wherein said trench has a width between 2 and 50 $\mu$m and a depth between 500 Å and 10,000 Å.

10. The method of claim 1 wherein said gate dielectric layer is comprised of silicon oxide.

11. The method of claim 1 wherein said first doped layer, and said second doped layer, are comprised of a first type conductivity material and said first channel is comprised of a second conductivity type material; said third doped layer, said fourth doped layer are comprised of a second type conductivity material and said second channel is comprised of a first conductivity type material; said first conductivity type is n-type and said second conductivity type is p-type.

12. The method of claim 1 wherein said cap layer comprised of silicon oxide thickness of between about 1000 Å and 20,000 Å.

13. A method of fabrication of a vertical transistor; comprising the steps of:

a) forming a doped region in a substrate;

b) forming sequentially on said substrate, a first spacer dielectric layer, a first gate electrode, a second spacer dielectric layer, a second gate electrode and a third spacer dielectric layer;

c) forming a masking layer having an opening over said a third spacer dielectric layer;

d) forming a trench through said first spacer dielectric layer, said first gate electrode, said second spacer dielectric layer, said second gate electrode and said third spacer dielectric layer; said trench having sidewalls;

e) removing the masking layer;

f) forming a gate dielectric layer over said sidewalls of said trench;

g) forming sequentially, in said trench: a first doped layer, a first channel layer, a second doped layer, a third doped layer, a second channel layer, and a fourth doped layer;

h) forming a cap layer over said third spacer dielectric layer and said fourth doped layer; and i) forming contacts to said doped region, said first gate electrode said second doped layer, and said fourth doped layer;

said first doped layer, and said second doped layer, are comprised of a first type conductivity material and said first channel is comprised of a second conductivity material; said third doped layer, said fourth doped layer are comprised of a second type conductivity material and said second channel is comprised of a first conductivity type material; said first conductivity type is n-type and said second conductivity type is p-type.

14. The method of claim 13 wherein said doped region is a n-doped region formed by an ion implant process.

15. The method of claim 13 wherein said doped region is a n-doped region formed by an ion implant process concentration between 1E19 and 1E23 atom/cc.

16. The method of claim 13 wherein said first spacer dielectric layer is comprised of silicon oxide.

17. The method of claim 13 wherein said first gate electrode is comprised of polysilicon.

18. The method of claim 13 wherein said second spacer dielectric layer is comprised of silicon oxide.

19. The method of claim 13 wherein said second gate electrode is comprised of polysilicon.

20. The method of claim 13 wherein said third spacer dielectric layer is comprised of silicon oxide.

21. The method of claim 13 wherein said trench having a width between 2 and 50 $\mu$m and a depth between 500 Å and 10,000 Å.

22. The method of claim 13 wherein said gate dielectric layer is comprised of silicon oxide.

23. The method of claim 13 wherein said cap layer is comprised of silicon oxide thickness of between about 1000 Å and 20,000 Å.

24. A method of fabrication of a vertical transistor; comprising the steps of:

a) forming a doped region in a substrate;
  (1) said doped region is a doped with a first type conductivity impurity and has a concentration between 1E19 and 1E23 atom/cc;

b) forming sequentially on said substrate, a first spacer dielectric layer, a first gate electrode, a second spacer dielectric layer, a second gate electrode and a third spacer dielectric layer;
  (1) said first spacer dielectric layer is comprised of silicon oxide;
  (2) said first gate electrode is comprised of polysilicon;
  (3) said second spacer dielectric layer is comprised of silicon oxide;
  (4) said a second gate electrode is comprised of polysilicon;
  (5) said third spacer dielectric layer is comprised of silicon oxide;

c) forming a masking layer having an opening over said a third spacer dielectric layer;

d) forming a trench through said first spacer dielectric layer, said first gate electrode, said second spacer dielectric layer, said second gate electrode and said third spacer dielectric layer; said trench having sidewalls;

(1) said trench having a width between 2 and 50 μm and a depth between 500 and 10,000 Å;
e) removing the masking layer;
f) forming a gate dielectric layer over said sidewalls of said trench; said gate dielectric layer is comprised of silicon oxide;
g) forming sequentially, in said trench, a first doped layer, a first channel layer, a second doped layer, a third doped layer, a second channel layer, and a fourth doped layer;
  (1) said first doped layer, and said second doped layer, are comprised of a first type conductivity material and said first channel is comprised of a second conductivity material; said third doped layer, said fourth doped layer are comprised of a second type conductivity material and said second channel is comprised of a first conductivity material;

h) forming a cap layer over said third spacer dielectric layer and said fourth doped layer; and
i) forming contacts to said doped region, said first gate electrode said second doped layer, and said fourth doped layer;
  (1) said cap layer comprised of silicon oxide thickness of between about 1000 and 20,000 Å.

25. The method of claim 24 wherein said first conductivity type is p-type and said second conductivity type is n-type.

26. The method of claim 24 wherein said first conductivity type is n-type and said second conductivity type is p-type.

* * * * *

UNITED STATES PATENT AND TRADEMARK OFFICE
CERTIFICATE OF CORRECTION

PATENT NO. : 6,544,824 B1
DATED : April 8, 2003
INVENTOR(S) : Yelehanka Ramachandramurthy Pradeep et al.

It is certified that error appears in the above-identified patent and that said Letters Patent is hereby corrected as shown below:

<u>Title page,</u>
Item [75], delete "Yelehanka Pradeep" and replace with -- Yelehanka Ramachandramurthy Pradeep --, and delete "Ying Keung, Aberdeen (HK)" and replace with -- Ying Keung Leung, Hong Kong (HK) --.

Signed and Sealed this

Nineteenth Day of August, 2003

JAMES E. ROGAN
*Director of the United States Patent and Trademark Office*